United States Patent
Jin

(10) Patent No.: US 10,998,388 B2
(45) Date of Patent: May 4, 2021

(54) DISPLAY SCREEN, DISPLAY DEVICE AND MOBILE TERMINAL

(71) Applicant: GUANGDONG OPPO MOBILE TELECOMMUNICATIONS CORP., LTD., Dongguan (CN)

(72) Inventor: Yong Jin, Dongguan (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 529 days.

(21) Appl. No.: 15/854,900

(22) Filed: Dec. 27, 2017

(65) Prior Publication Data
US 2018/0315803 A1    Nov. 1, 2018

(30) Foreign Application Priority Data

Apr. 27, 2017    (CN) .......................... 201710289264.7

(51) Int. Cl.
*G06F 3/00*    (2006.01)
*H01L 27/32*    (2006.01)
(Continued)

(52) U.S. Cl.
CPC ...... *H01L 27/3234* (2013.01); *G02F 1/13338* (2013.01); *G06F 3/0412* (2013.01);
(Continued)

(58) Field of Classification Search
CPC ............... H01L 27/3234; H01L 27/323; H01L 27/14678; H01L 27/14623; G02F 1/13338;
(Continued)

(56) References Cited

U.S. PATENT DOCUMENTS 9,158,958 B2 * 10/2015 Wickboldt .............. G06F 21/32
9,423,830 B1 *  8/2016 Wei .................. B29D 11/00663
(Continued)

FOREIGN PATENT DOCUMENTS

CN       106506746 A      0/3201
CN       104881196 A      9/2015
(Continued)

OTHER PUBLICATIONS

Chinese Patent Application No. 201710289264.7, Office Action dated Aug. 8, 2019, 8 pages.
(Continued)

*Primary Examiner* — Manav Seth
(74) *Attorney, Agent, or Firm* — Lathrop GPM LLP

(57) ABSTRACT

The present disclosure provides a display screen, including a display layer and a light shielding layer. The display layer includes an upper surface and a lower surface opposite to the upper surface, the upper surface faces a user, the light shielding layer is arranged to the lower surface of the display layer, and the light shielding layer has a hole. The present disclosure further provides a display device, including the above-mentioned display screen and a fingerprint module disposed below the display screen. The fingerprint module is located at a position corresponding to the hole. The fingerprint module includes a light emitter and a light inductor, and a light signal emitted by the light emitter is transmitted to the fingerprint through the hole and the display layer, and is received by the light inductor after being reflected by the fingerprint. The present disclosure further provides a mobile terminal.

19 Claims, 5 Drawing Sheets

(51) Int. Cl.
  *G06F 3/041* (2006.01)
  *G02F 1/1333* (2006.01)
  *G06K 9/00* (2006.01)
  *G06F 3/042* (2006.01)
  *G02F 1/1335* (2006.01)
  *H01L 27/146* (2006.01)

(52) U.S. Cl.
  CPC ......... *G06F 3/0421* (2013.01); *G06K 9/0004* (2013.01); *G06K 9/00013* (2013.01); *H01L 27/323* (2013.01); *G02F 1/133512* (2013.01); *H01L 27/14623* (2013.01); *H01L 27/14678* (2013.01)

(58) Field of Classification Search
  CPC ............. G02F 1/133512; G06F 3/0412; G06F 3/0421; G06K 9/00013; G06K 9/0004
  See application file for complete search history.

(56) References Cited

U.S. PATENT DOCUMENTS

| | | | |
|---|---|---|---|
| 9,457,544 B1* | 10/2016 | Menon | B32B 7/12 |
| 9,507,162 B1* | 11/2016 | Menon | B32B 38/06 |
| 9,811,188 B1* | 11/2017 | Subbarayan | G06F 3/0412 |
| 9,836,165 B2* | 12/2017 | Nho | G06F 3/0421 |
| 9,890,074 B2* | 2/2018 | Liu | C03C 15/00 |
| 9,934,418 B2* | 4/2018 | Mienko | G06F 3/0421 |
| 9,946,861 B2* | 4/2018 | Yoon | G06F 21/32 |
| 9,971,456 B2* | 5/2018 | Abileah | G02F 1/13338 |
| 10,002,281 B2* | 6/2018 | Wu | G06K 9/0004 |
| 10,043,052 B2* | 8/2018 | Wickboldt | G06K 9/00053 |
| 10,049,254 B2* | 8/2018 | Wickboldt | G06K 9/00087 |
| 10,181,070 B2* | 1/2019 | Smith | G02B 5/005 |
| 10,216,975 B1* | 2/2019 | He | G06K 9/0004 |
| 10,229,316 B2* | 3/2019 | Wickboldt | H01L 27/3234 |
| 10,366,272 B2* | 7/2019 | Song | G06K 9/00033 |
| 10,437,974 B2* | 10/2019 | He et al. | G06K 9/00046 |
| 10,460,147 B2* | 10/2019 | Yang | G06F 1/1684 |
| 10,482,305 B1* | 11/2019 | Matsuyuki | G06K 9/0002 |
| 10,587,738 B2* | 3/2020 | Bao | G06F 3/0428 |
| 10,620,665 B2* | 4/2020 | Cheng | H04M 1/0264 |
| 10,627,937 B2* | 4/2020 | Ling | G06K 9/0004 |
| 10,650,789 B2* | 5/2020 | Zhou | G09G 1/165 |
| 10,657,347 B2* | 5/2020 | Zhang | G06F 21/32 |
| 10,659,582 B2* | 5/2020 | Cheng | H04M 1/03 |
| 10,667,218 B2* | 5/2020 | Zhang | H04L 63/0861 |
| 2008/0122803 A1* | 5/2008 | Izadi | G06F 3/0421 345/175 |
| 2008/0317303 A1 | 12/2008 | Konno | |
| 2010/0220900 A1 | 9/2010 | Orsley | |
| 2012/0328170 A1* | 12/2012 | Wu | G06K 9/00046 382/124 |
| 2014/0015772 A1 | 1/2014 | Tung et al. | |
| 2014/0218327 A1* | 8/2014 | Shi | G06K 9/0004 345/174 |
| 2015/0187980 A1* | 7/2015 | Yamamoto | H04N 5/2254 250/552 |
| 2016/0132712 A1* | 5/2016 | Yang | G06F 3/044 348/77 |
| 2016/0224816 A1 | 8/2016 | Smith et al. | |
| 2016/0266695 A1 | 9/2016 | Bae et al. | |
| 2017/0017824 A1* | 1/2017 | Smith | G02B 5/005 |
| 2017/0061193 A1* | 3/2017 | Young | G06K 9/0002 |
| 2017/0091506 A1* | 3/2017 | Sinha | G06F 21/32 |
| 2017/0109564 A1* | 4/2017 | Seo | G06K 9/00067 |
| 2017/0220838 A1* | 8/2017 | He | G06F 3/0412 |
| 2017/0344785 A1* | 11/2017 | Zhang | G06K 9/0004 |
| 2018/0039408 A1* | 2/2018 | Cheong | G06F 3/04886 |
| 2018/0181787 A1* | 6/2018 | Jee | G06F 3/044 |

FOREIGN PATENT DOCUMENTS

| | | |
|---|---|---|
| CN | 105094227 A | 11/2015 |
| CN | 105184248 A | 12/2015 |
| CN | 105550664 A | 5/2016 |
| CN | 105872137 A | 8/2016 |
| CN | 106096595 A | 11/2016 |
| CN | 106298859 A | 1/2017 |
| CN | 106336725 A | 1/2017 |
| CN | 106385475 A | 2/2017 |
| CN | 106886767 A | 6/2017 |
| CN | 107102693 A | 8/2017 |
| CN | 107193412 A | 9/2017 |
| CN | 107194321 A | 9/2017 |
| EP | 3316093 A1 | 5/2018 |
| JP | 2009003821 A | 1/2009 |
| JP | 3208984 U | 3/2017 |
| KR | 20070005547 A | 1/2007 |
| TW | 201234078 A | 8/2012 |
| TW | M532056 U | 11/2016 |
| WO | WO 2015192630 A | 12/2015 |
| WO | WO 2017129126 A1 | 8/2017 |

OTHER PUBLICATIONS

Chinese Patent Application No. 201710289264.7, English translation of Office Action dated Aug. 8, 2019, 10 pages.
European Patent Application No. 19168690.6, Extended Search and Opinion dated Jul. 9, 2019, 9 pages.
Chinese Patent Application No. 201710289264.7 Office Action dated Mar. 29, 2019, 9 pages.
Chinese Patent Application No. 201710289264.7 English translation of Office Action dated Mar. 29, 2019, 10 pages.
PCT/CN2018/071313 International Search Report and Written Opinion dated Mar. 27, 2018 10 pages.
Patent Application No. 17210877.1 extended Search and Opinion dated Jun. 6, 2018, 9 pages.
Taiwan Patent Application No. 106143685 Office Action dated Jun. 21, 2018, 4 pages.
Indian Patent Application No. 201834000063, Office Action dated Jun. 30, 2020, 6 pages.
Japanese Patent Application No. 2019-537264, Office Action dated Aug. 21, 2020, 5 pages.
Japanese Patent Application No. 2019-537264, English translation of Office Action dated Aug. 21, 2020, 4 pages.
Singapore Patent Application No. 11201906187P, Office Action dated Jun. 23, 2020, 11 pages.
Japanese Patent Application No. 2019-537264, Office Action dated Nov. 27, 2020, 4 pages.
Japanese Patent Application No. 2019-537264, English translation of Office Action dated Nov. 27, 2020, 4 pages.
European Patent Application No. 19168690.6, Office Action dated Feb. 15, 2021, 7 pages.

\* cited by examiner

DISPLAY SCREEN, DISPLAY DEVICE AND MOBILE TERMINAL

CROSS-REFERENCE TO RELATED APPLICATIONS

The application claims priority to and benefits of Chinese Patent Application Serial No. 201710289264.7, filed with the State Intellectual Property Office of P. R. china on Apr. 27, 2017, the entire content of which is incorporated herein by reference.

FIELD

The present disclosure relates to a field of display technology, and specifically to a display screen, a display device and a mobile terminal.

BACKGROUND

With the rocketing development of the information era, people pay more and more attention to information security issues. The mobile terminals are mostly provided with a fingerprint recognition module used for fingerprint recognition for a user of the mobile terminal, so as to improve the security of the mobile terminal. In the related art, the fingerprint recognition module is disposed out of a display area of a display panel so as to be prevented from hindering the display. A display area-to-screen ratio (the ratio of the display area to the whole display screen) is small with such a structure design, which influences the user experience. Therefore, with such a method that the fingerprint module and the display screen are disposed in a superposition manner, the display area-to-screen ratio can be increased. However, in such a structure, the display screen blocks a sensing signal of the fingerprint module, which causes low fingerprint acquisition efficiency of the fingerprint module and reduces the user experience.

SUMMARY

The present disclosure provides a display screen, including a display layer and a light shielding layer. The display layer includes an upper surface and a lower surface opposite to the upper surface, the upper surface is configured to face a user, the light shielding layer is arranged to the lower surface of the display layer, the light shielding layer has a hole to allow a sensing signal of a fingerprint module to pass through.

The present disclosure provides a display screen, including the above-mentioned display screen, and further including a fingerprint module for recognizing fingerprints from a user and a frame. The display screen and the fingerprint module are fastened to the frame, and the fingerprint module is disposed at a side of the light shielding layer away from the display layer and located at a position corresponding to the hole. The fingerprint module includes a light emitter and a light inductor, and a first light signal emitted by the light emitter and a second light signal received by the light inductor can pass through the hole.

The present disclosure further provides a mobile terminal, including the above-mentioned display device.

BRIEF DESCRIPTION OF THE DRAWINGS

To describe the technical solutions in the embodiments of the present disclosure more clearly, the accompanying drawings required for describing the embodiments are briefly introduced in the following. Apparently, the accompanying drawings in the following description show merely some embodiments of the present disclosure, those ordinarily skilled in the art can also derive other drawings from these accompanying drawings without creative efforts.

DETAILED DESCRIPTION

The technical solutions of the embodiments of the present disclosure are clearly and completely described below with reference to the accompanying drawings in the embodiments of the present disclosure.

Figure 1:
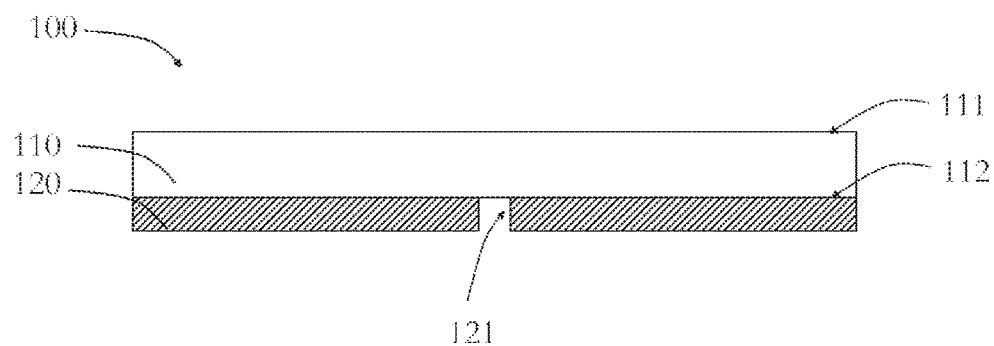
FIG. 1 is a sectional schematic view of a display screen provided in an embodiment of the present disclosure.

Referring to FIG. 1, FIG. 1 illustrates a display screen 100 provided by an embodiment of the present disclosure. The display screen 100 includes a display layer 110 and a light shielding layer 120. The display layer 110 includes an upper surface 111 (an example of a first surface) and a lower surface 112 (an example of a second surface) opposite to the upper surface, and the upper surface 111 of the display layer 110 is configured to face a user. The light shielding layer 120 is fastened to the lower surface 112 of the display layer 110. In an embodiment, the light shielding layer 120 is affixed to the lower surface 112 of the display layer 110 and configured to block light from penetrating the display layer 110, so as to hide inner structures below the display layer 110 from view and display a color of the light shielding layer 120 when the display layer 110 is in a non-luminous state. The light shielding layer 120 has a hole 121 to allow a sensing signal of a fingerprint module to pass through. In the present embodiment, the fingerprint module is an optical fingerprint recognition module, and the hole 121 is configured to allow a light signal emitted and received by the fingerprint module to pass through.

Figure 2:
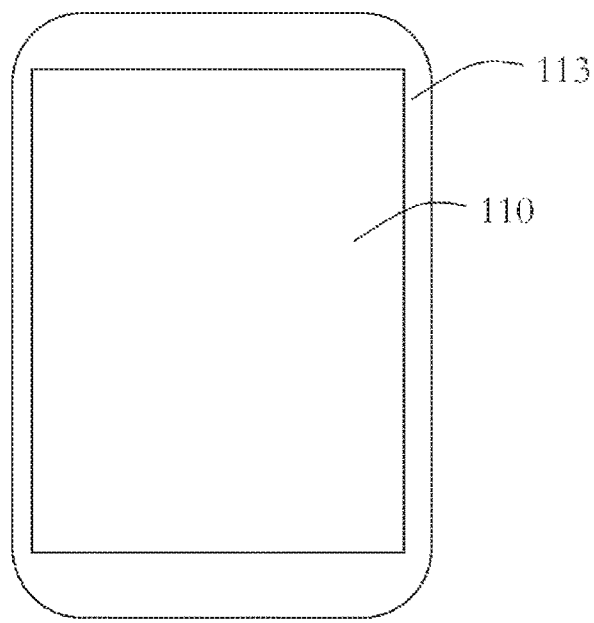
FIG. 2 is a top view of a display screen provided in an embodiment of the present disclosure.

Referring to FIG. 2, the display layer 110 mentioned in embodiment of the present application refers to a portion, configured to display an image, of the display screen 100. The display screen 100 can also include a non-display layer 113 disposed surrounding the display layer 110. The non-display layer 113 is disposed surrounding the display layer 110 and can be used to mount some electronic elements and components that are not disposed in the display layer 110, such as a camera module, an amplifier, or a telephone receiver and the like.

It could be understood that the display layer 110 mentioned in embodiment of the present application is a light-transparent layer, so as to make it convenient for the fingerprint module to emit and receive the light signal through the display layer 110. As the display layer 110 is the light-transparent layer, in order to prevent structures below the display screen 100 (such as the electronic circuits) from being seen, the light shielding layer 120 is usually disposed below the display layer 110. The light shielding layer 120 can be a light-shieling foam layer, or a lightproof ink layer. The light shielding layer 120 can hide structures (such as the electronic circuits) below the display screen 100 from view and enables the display layer 110 to present the color of the light shielding layer 120 when the display screen 100 is in the non-luminous state. The light shielding layer 120 can be black, white or other colors.

Figure 3:
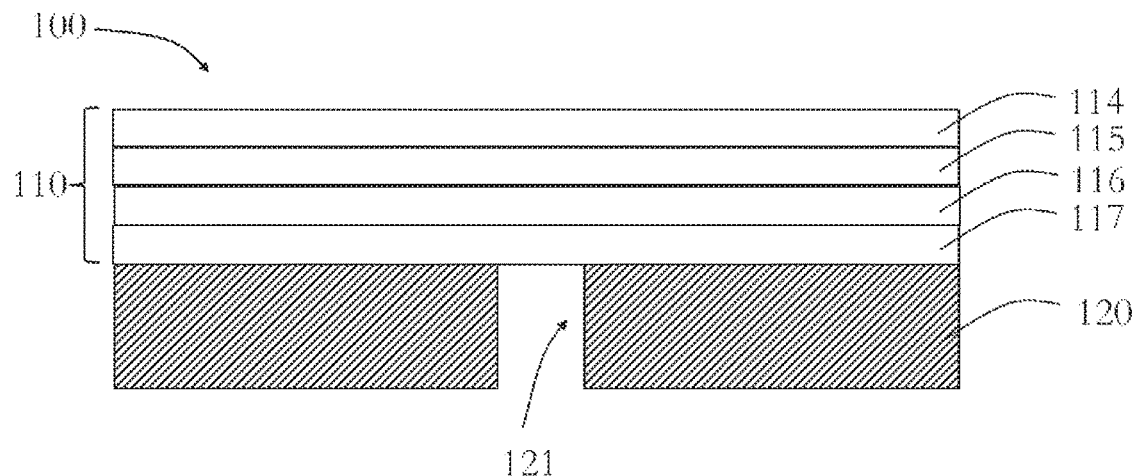
FIG. 3 is a sectional schematic view of a display screen provided in an embodiment of the present disclosure.

Referring to FIG. 3, the display layer 110 includes an upper covering plate 114, a touch sensitive layer 115, an organic luminous layer 116, and a lower covering plate 117 superposed in sequence. The light shielding layer 120 can be affixed to the lower covering plate 117. In an embodiment, the light shielding layer 120 is the lightproof ink layer. The hole 121 is disposed in the lightproof ink layer 120, that is, a patterned lightproof ink layer is disposed to the lower covering plate 117, and the patterned lightproof ink layer can be formed on the lower covering plate 117 in a printing, spin coating, coating, or evaporation method. In another embodiment, the light shielding layer 120 is the foam layer, and the foam layer 120 can play a cushioning and damping role between the lower covering plate 117 and other electronic elements and components. The foam layer 120 can be affixed to the lower covering plate 117 by means of a sealant. The hole 121 can be processed and formed in the foam layer after the processing of the foam layer is finished, or during the processing of the foam layer.

Further, the hole 121 can be a circular hole, a square hole, an oval hole or an irregular shaped hole. The irregular shaped hole can be a shape adapted to a shape of a contact surface of a fingerprint face contacting with the display screen 100.

Figure 4:
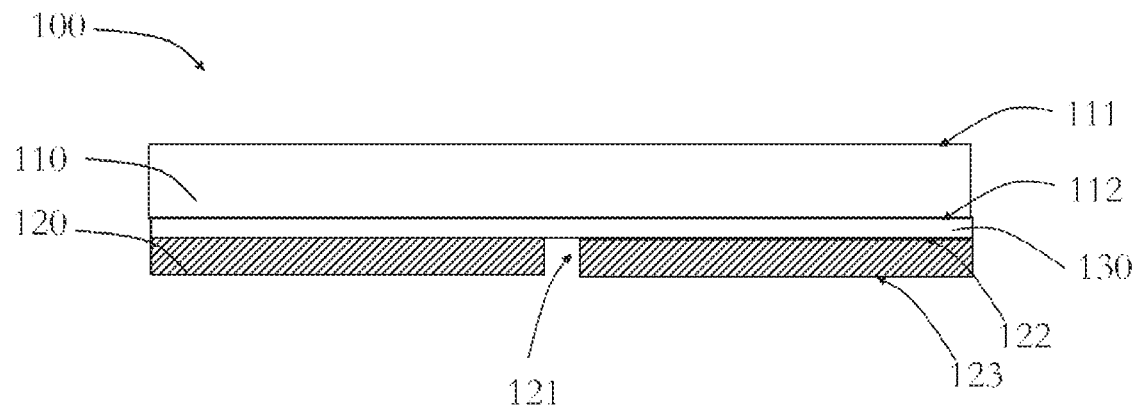
FIG. 4 is a schematic view of a display screen provided in a first embodiment of the present disclosure.

Further, referring to FIG. 4, the display screen 100 further includes a light shielding sheet 130. The light shielding sheet 130 is disposed between the display layer 110 and the fingerprint module in the superposition manner and covers the hole 121, so as to hide the fingerprint module and enhance a visual effect of the display screen 100. Specifically, the light shielding sheet 130 covers the hole 121 and is permeable to the light signal, so as to enable the light signal emitted and received by the fingerprint module disposed below the hole 121 to penetrate, and reflect light to hide the fingerprint module. Preferably, reflected light of the light shielding sheet 130 has the same color as reflected light of the light shielding layer 120, so as to make an area of the hole 121 have the same display color as other non-perforated areas of the light shielding layer 120 when the display layer 110 is in a non-display state for example a screen-off state of the mobile terminal, thus reducing visual influence of the hole 121 on the user and enhancing user experience.

Figure 5:
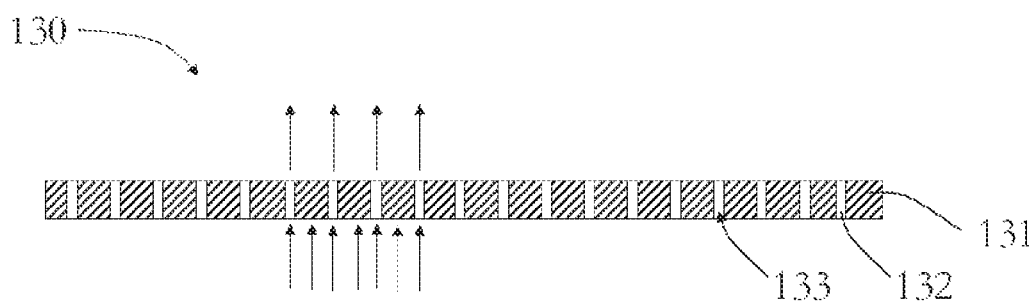
FIG. 5 is a sectional schematic view of a light shielding sheet provided in an embodiment of the present disclosure.

In an embodiment, referring to FIG. 5, the light shielding sheet 130 include a light shielding pigment 131 and a light-transparent material 132. The light shielding pigment 131 has a similar color to the light shielding layer 120. It could be understood that the color of the light shielding pigment 131 and the color of the light shielding layer 120 are the same when sensed by the user's naked eyes. The color of the light shielding layer 120 can be black, white or other colors, and correspondingly, the color of the light shielding pigment 131 can also be black, white or other colors. Specifically, when the color of the light shielding layer 120 is black, the color of the light shielding pigment 131 is also black, so that the color of the area of the hole 121 and the color of other non-perforated areas of the light shielding layer 120 are consistent, thus reducing the visual influence.

The light-transparent material 132 forms a light-penetrating passage 133, the light-penetrating passage 133 is along a thickness direction of the display screen 100, and the fingerprint module emits and receives the light signal through the light-penetrating passage 133. The light-penetrating passage 133 can increase light transmittance of the light shielding sheet 130. The increase of the light transmittance of the light shielding sheet 130 increases transmittance of an incident light emitted from the fingerprint module to the fingerprint, thereby strength of the reflected light from the fingerprint is increased, and transmittance of the reflected light is increased, thus improving accuracy of fingerprint recognition.

The light-transparent material 132 can be a transparent material such as resin particles, glass powders, or a mixture of resin particles and glass powders. These transparent materials have a certain light transmission property and allow light (arrow part in FIG. 5) to pass through. When the light shielding sheet 130 is added with the light-transparent material 132, the light transmission property of the light shielding sheet 130 can be increased. The light-transparent material 132 is formed to be granular. If a granule of the light-transparent material 132 is too small, the light transmission cannot be achieved. If the granule of the light-transparent material 132 is too large, a color difference exists between the light shielding sheet 130 and the light shielding layer 120. Therefore, optionally, a size of the granule of the light-transparent material 132 is 1~20 μm. Further, if a ratio of the light-transparent material 132 to the light shielding sheet 130 is too low, the light transmission property of the light shielding sheet 130 cannot be increased effectively. If the ratio of the light-transparent material 132 to the light shielding sheet 130 is too high, the color of the light shielding sheet 130 will be influenced. Therefore, a mass percent of the light-transparent material 132 to the light shielding sheet 130 is 1%~20%.

Further, the light shielding sheet 130 can be manufactured to be a membrane or a sheet having the light-penetrating passage 133 and then be stuck onto a substrate, and an optical cement can be used for sticking. The light-penetrating passage 133 is processed in the membrane or the sheet of the light shielding sheet 130, and thus the display screen 110 is not influenced.

First Embodiment

Referring to FIG. 4, the light shielding sheet 130 is disposed between the display layer 110 and the light shielding layer 120 in the superposition manner. Specifically, the light shielding sheet 130 can be affixed to the lower covering plate 117 of the display layer 110, or the light shielding sheet 130 can be affixed to an upper surface 122 of the light shielding layer 120. In the present embodiment, the light shielding sheet 130 is disposed between the display layer 110 and the light shielding layer 120, and such a structure design allows the lower covering plate 117 of the display layer 110 to serve as the substrate for affixing of the light shielding sheet 130, thus realizing formation of the light shielding sheet 130 at a lower surface of the lower covering plate 117, which can avoid destroying the structure of the display screen 100 and simplify production process and cost of the light shielding sheet 130.

Second Embodiment

Figure 6:
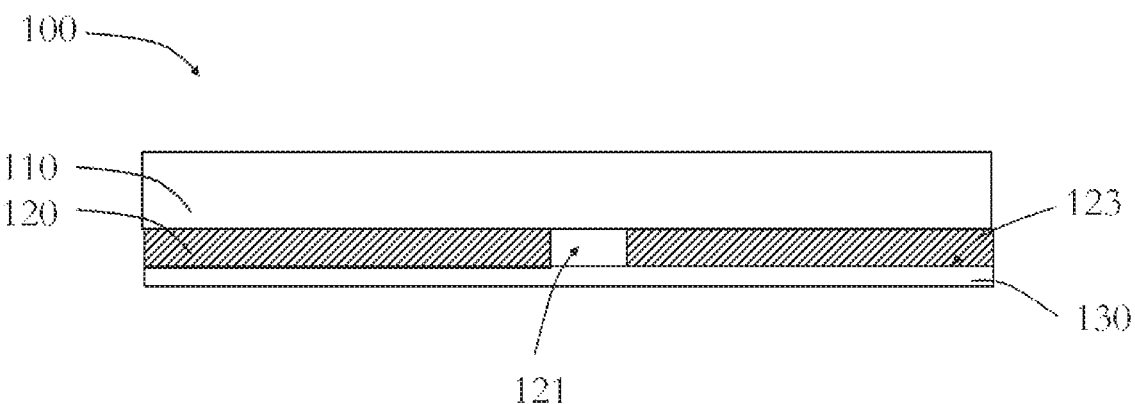
FIG. 6 is a schematic view of a display screen provided in a second embodiment of the present disclosure.

Referring to FIG. 6, the light shielding sheet 130 is fastened to a first surface 123 of the light shielding layer 120, and the first surface 123 is disposed at a side away from the display layer 110. In the present embodiment, the light shielding sheet 130 is disposed at a side of the light shielding layer 120 away from the display layer 110, and with such a structure design, the light shielding layer 120 can be fastened to the display layer 110 and then be affixed to the light shielding sheet 130, that is, the affixation of the light shielding sheet 130 is performed after a position and shape of the hole 121 is determined, which can improve accuracy of covering the hole 121 by the light shielding sheet 130 and reduce technique difficulty of covering the hole 121 by the light shielding sheet 130.

Third Embodiment

Figure 7:
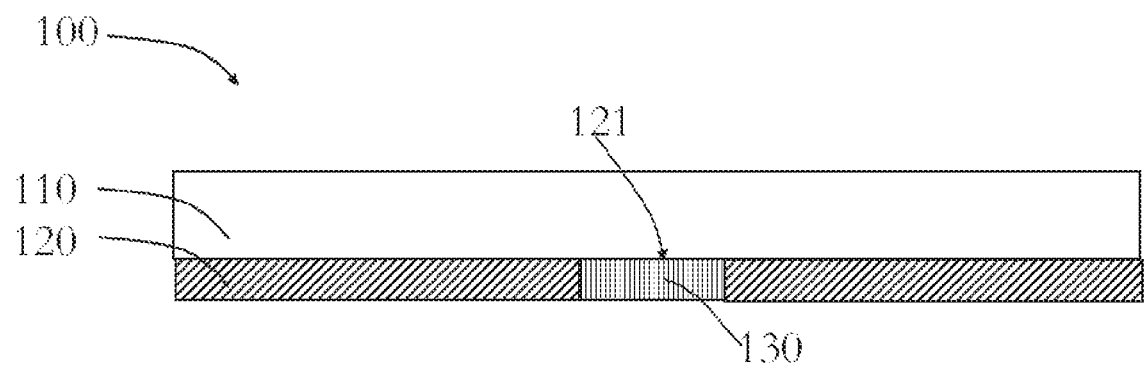
FIG. 7 is a schematic view of a display screen provided in a third embodiment of the present disclosure.

Referring to FIG. 7, the light shielding sheet 130 is filled in the hole 121. In an embodiment, the hole 121 is fully filled with the light shielding sheet 130, that is, a size and shape of the light shielding sheet 130 is consistent with a size and shape of the hole 121, and the light shielding sheet 130 and the light shielding layer 120 are in a common layer and have the same thickness. Such a structure design allows the light shielding sheet 130 and the light shielding layer 120 to be in the same layer, so that respective thicknesses of the light shielding sheet 130 and the light shielding layer 120 are decreased significantly and flatness of the light shielding layer 120 is increased on one aspect, hence decreasing the thickness of the display screen 100, and promoting light and thin development of the mobile terminal.

Figure 8:
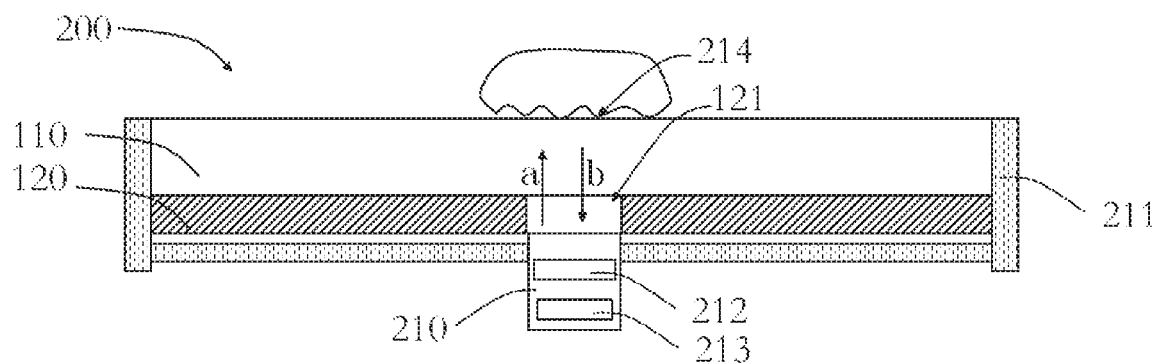
FIG. 8 is a sectional schematic view of a display device provided in an embodiment of the present disclosure.

Referring to FIG. 8, embodiments of the present disclosure provide a display device 200, which includes the display screen 100 according to any one of the above-mentioned embodiments, and further includes a fingerprint module 210 for recognizing fingerprints from a user and a frame 211. The display screen 100 and the fingerprint module 210 are fastened to the frame 211. The fingerprint module 210 is disposed at a side of the light shielding layer 120 away from the display layer 110 and located at a position corresponding to the hole 121. The fingerprint module 210 includes a light emitter 213 and a light inductor 212, and a first light signal emitted by the light emitter 213 and a second light signal received by the light inductor 212 pass through the hole 121. It could be understood that the fingerprint module 210 is an optical fingerprint recognition module. The light emitter 213 can be a light source such as an LED and the like and be configured to emit incident light to the fingerprint 214. The LED light source can be disposed at a position corresponding to the light-penetrating passage 133, the LED source light can also be converted into an area light source by means of a light guide plate so as to increase the transmittance of the incident light in the light shielding sheet 130. The light inductor 212 can be a photosensitive sensor for receiving reflected light b formed by the fingerprint 214. The light inductor 212 is fastened at a top of the fingerprint module 210, i.e. in a place adjacent to the hole 121.

When a finger is pressed on the display screen 100, light emitted by the light emitter 213 forms the incident light a. The incident light a is cast on the fingerprint 214 through the light inductor 212, the hole 121 and the display layer 110. The reflected light b is formed by the reflection of the fingerprint 214, the reflected light b is received by the light inductor 212, and a fingerprint image of fingerprint 214 is obtained after the reflected light b is processed.

Figure 9:
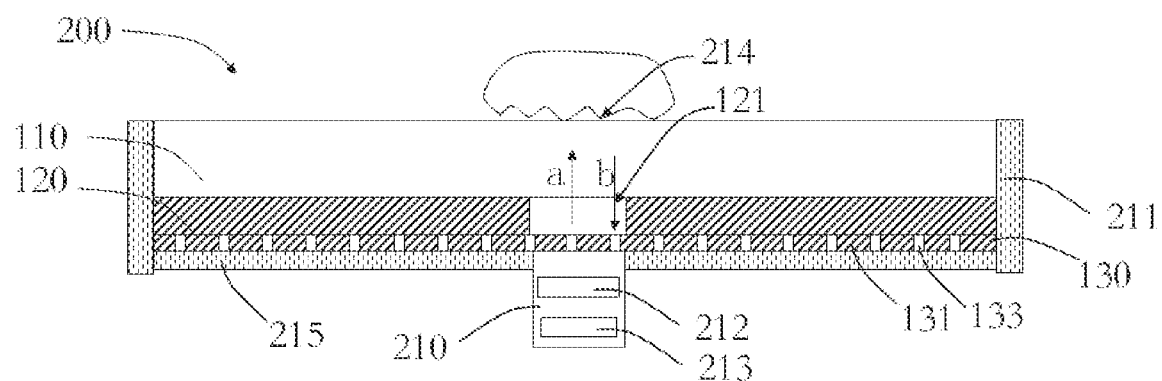
FIG. 9 is a schematic view of a display device provided in a first embodiment of the present disclosure.

In an embodiment, referring to FIG. 9, the display screen 100 further includes the light shielding sheet 130. The light shielding sheet 130 is disposed between the display layer 110 and the fingerprint module in the superposition manner and covers the hole 121, so as to hide the fingerprint module 210 and enhance the visual effect of the display screen 100. The light shielding sheet 130 includes the light shielding pigment 131 and the light-transparent material 132, the light-penetrating passage 133 is formed by the light-transparent material 132, the light-penetrating passage 133 is along the thickness direction of the display screen 100, and the fingerprint module 210 emits or receives the light signal through the light-penetrating passage 133. The light-penetrating passage 133 can increase the light transmittance of the light shielding sheet 130. The light shielding pigment 131 has a similar color to the light shielding layer 120, thus reducing the visual influence.

Referring to FIG. 9, when the finger contacts a surface of the display screen 100, the light emitted by the light emitter 213 forms the incident light a, and the incident light a is cast on the fingerprint 214 through the light inductor 212, the light shielding sheet 130, the hole 121 and the display layer 110 in sequence. As the light-transparent material 132 is added to the light shielding sheet 130, the light-transparent material 132 can improve the transmittance of the light shielding sheet 130. Therefore, the light shielding sheet 130 has less influence on the incident light a, and the strength of the incident light a cast on the fingerprint 214 is higher. Correspondingly, the strength of the reflected light b formed by the incident light a being reflected by the fingerprint 214 is also higher. In addition, the reflected light b formed by the reflection of the fingerprint 214 is cast on the light inductor 212 passing through the display layer 110, the hole 121, and the light shielding sheet 130 in sequence, and is received by the light inductor 212 and forms the fingerprint image.

First Embodiment

Referring to FIG. 9, the light shielding sheet 130 is disposed between the display screen 100 and the fingerprint module 210 in the superposition manner. Specifically, the light shielding sheet 130 is disposed between a bottom 215 of the frame 211 and the light shielding layer 120 in the superposition manner.

Second Embodiment

Figure 10:
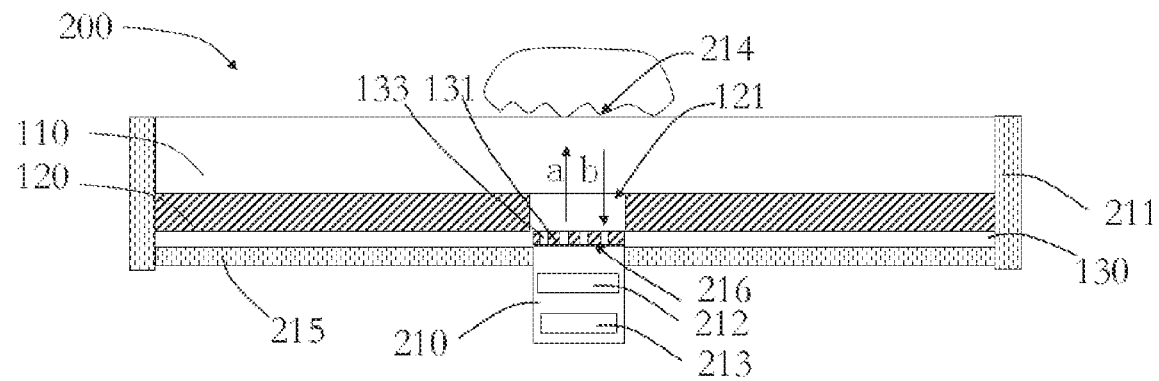
FIG. 10 is a schematic view of a display device provided in a second embodiment of the present disclosure.

Referring to FIG. 10, the light shielding sheet 130 is fastened between the display screen 100 and the fingerprint module 210. Specifically, the fingerprint module 210 includes a second surface 216, the second surface 216 is adjacent to the hole 121, and the light shielding sheet 130 can be affixed to the second surface 216.

Third Embodiment

Figure 11:
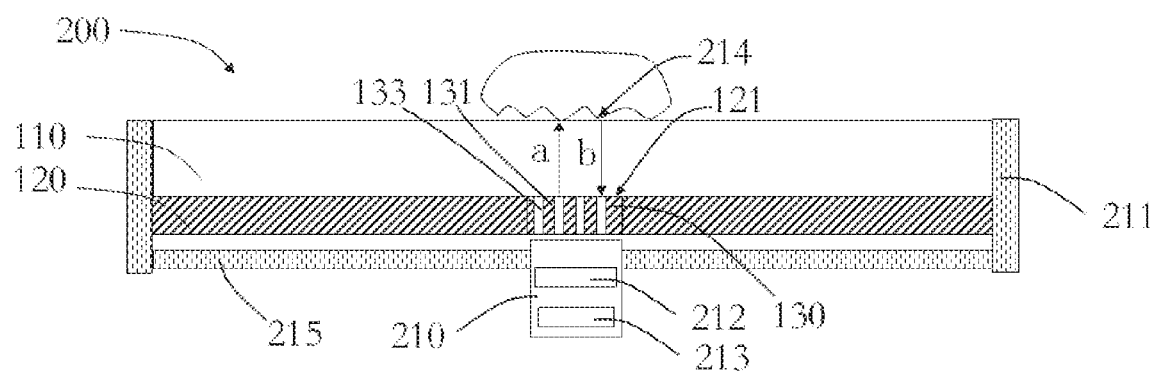
FIG. 11 is a schematic view of a display device provided in a third embodiment of the present disclosure.

Referring to FIG. 11, the light shielding sheet 130 is disposed in the hole 121. The light shielding sheet 130 can be fully filled in the hole 121, that is, the size and shape of the light shielding sheet 130 are consistent with those of the hole 121, and the light shielding sheet 130 and the light shielding layer 120 are in the same layer and have the same thickness. An orthographic projection of the light shielding sheet 130 on the fingerprint module 210 covers the light inductor 212 and the light emitter 213, so as to make it convenient for the incident light emitted by the light emitter 213 to be cast on the fingerprint 214 through the hole 121 and the light shielding sheet 130, and for the light reflected by the fingerprint 214 to be cast on the light inductor 212 through the hole 121 and the light shielding sheet 130.

Figure 12:
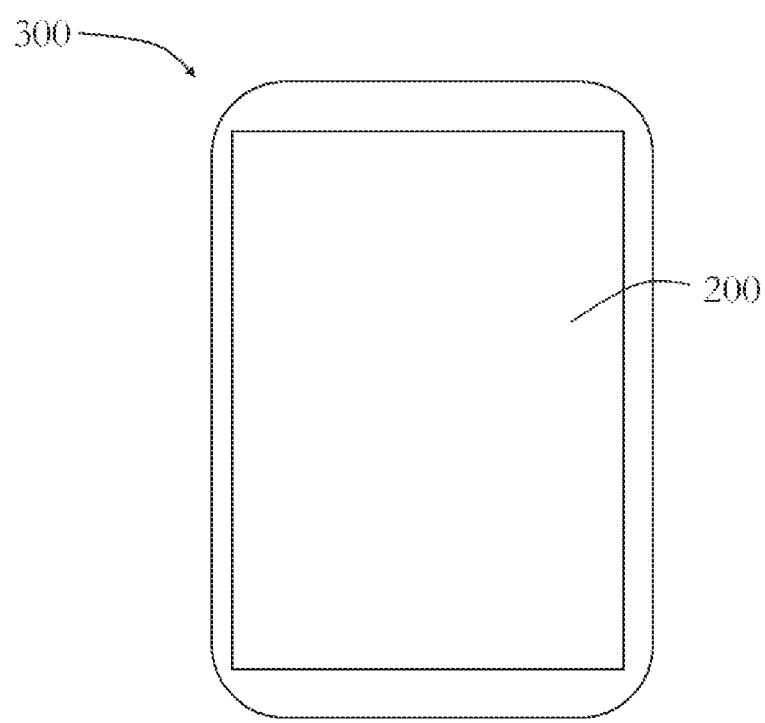
FIG. 12 is a schematic view of a mobile terminal provided in an embodiment of the present disclosure.

Referring to FIG. 12, embodiments of the present disclosure provide a mobile terminal 300, including the display device 200 in any one of the above-mentioned embodiments.

Regarding the display screen 100, the display device 200 and the mobile terminal 300 provided in embodiments of the present disclosure, the display device 200 includes the display screen 100 and the fingerprint module 210 disposed below the display screen 100. The display screen 100 includes the display layer 110 and the light shielding layer 120, the light shielding layer 120 is fastened to the lower surface 112 of the display layer 110, and the light shielding layer 120 has the hole 121. The fingerprint module 210 is located at the position corresponding to the hole 121. The fingerprint module 210 includes the light emitter 213 and the light inductor 212, the light signal emitted by the light emitter 213 is transmitted to the fingerprint 214 through the hole 121 and the display layer 110, and then is received by the light inductor 212 through the display layer 110 and the hole 121 after being reflected by the fingerprint 214, thus improving the fingerprint acquisition and recognition efficiency of the fingerprint module 210. In addition, by providing the light shielding sheet 130 to cover the hole 121 so as to hide the fingerprint module 210, the visual influence of the hole 121 on the user is reduced and the user experience is enhanced.

In summary, the preferred embodiments of the present disclosure has been disclosed as above, but the preferred embodiments are not intended to limit the present disclosure, those ordinarily skilled in the art can make various changes and retouched without departing from the spirit and scope of the present disclosure. Therefore, the protection scope of the present disclosure is defined by the claims.

The above are the preferred embodiments of the present disclosure. It should be noted that those skilled in the art can make some improvements and retouches without departing from the principle of the present disclosure, which are also deemed as the protection scope of the present disclosure.

What is claimed is:

1. A display screen, comprising a display layer and a light shielding layer, the display layer having a first surface and a second surface opposite to the first surface, the first surface being configured to face a user, the light shielding layer being arranged to the second surface of the display layer, the light shielding layer having a hole to allow a light signal received by a fingerprint module to pass through, wherein the light shielding layer is configured to block light from penetrating the display layer, wherein the fingerprint module is an optical fingerprint module, and the hole is configured to allow light signals emitted and received by the fingerprint module to pass through.

2. The display screen according to claim 1, wherein the light shielding layer is selected from a group consisting of a lightproof ink layer and a foam layer.

3. The display screen according to claim 1, wherein the display layer comprises an upper covering plate, a touch sensitive layer, an organic luminous layer, and a lower covering plate superposed in sequence.

4. The display screen according to claim 1, wherein the hole is selected from a group consisting of a circular hole, a square hole, an oval hole and an irregular shaped hole, and the irregular shaped hole is in a shape in match with a shape of a contact surface between a finger and the display screen.

5. The display screen according to claim 1, further comprising a light shielding sheet, wherein the light shielding sheet is disposed between the display layer and the fingerprint module in the superposition manner and covers the hole; the light shielding sheet comprises a light shielding pigment and a light-transparent material, a light-penetrating passage is formed by the light-transparent material, the fingerprint module emits and receive the light signal through the light-penetrating passage, and the light shielding pigment has a similar color to the light shielding layer.

6. The display screen according to claim 5, wherein the light shielding sheet is disposed between the display layer and the light shielding layer in the superposition manner.

7. The display screen according to claim 5, wherein the light shielding layer has a first surface away from the display layer, and the light shielding sheet is affixed to the first surface of the light shielding layer.

8. The display screen according to claim 5, wherein the light shielding sheet is disposed in the hole.

9. The display screen according to claim 5, wherein the fingerprint module has a second surface adjacent to the hole, and the light shielding sheet is affixed to the second surface.

10. A display device, comprising a display screen, a fingerprint module for recognizing fingerprints from a user and a frame, the display screen comprising a display layer and a light shielding layer, the display layer comprising a first surface and a second surface opposite to the first surface, the light shielding layer being arranged to the second surface of the display layer, the light shielding layer having a hole to allow a light signal received by a fingerprint module to pass through, the display screen and the fingerprint module being fastened to the frame, the fingerprint module being disposed at a side of the light shielding layer away from the display layer and located at a position corresponding to the hole, wherein the fingerprint module is configured to emit and receive light signals passing through the hole.

11. The display device according to claim 10, further comprising a light shielding sheet, wherein the light shielding sheet is disposed between the display layer and the fingerprint module in a superposition manner and covers the hole; the light shielding sheet comprises a light shielding pigment and a light-transparent material, a light-penetrating passage is formed by the light-transparent material, the fingerprint module emits and receives the light signal through the light-penetrating passage, and the light shielding pigment has a similar color to the light shielding layer.

12. The display device according to claim 11, wherein a size of a granule of the light-transparent material is 1~20 μm.

13. The display device according to claim 11, wherein a mass percent of the light-transparent material to the light shielding sheet is 1%~20%.

14. The display device according to claim 11, wherein the light-transparent material is selected from a group consisting of resin particles, glass powders, and a mixture of resin particles and glass powders.

15. The display device according to claim 11, wherein the light shielding layer has a first surface away from the display layer, and the light shielding sheet is affixed to the first surface of the light shielding layer.

16. The display device according to claim 11, wherein the fingerprint module has a second surface adjacent to the hole, and the light shielding sheet is affixed to the second surface.

17. The display device according to claim 11, wherein the light shielding sheet is fully filled in the hole, a size and shape of the light shielding sheet are consistent with a size and shape of the hole.

18. A mobile terminal, comprising a display device, the display device comprising a display screen, a fingerprint module for recognizing fingerprints from a user and a frame, the display screen comprising a display layer and a light shielding layer, the display layer comprising an upper surface and a lower surface opposite to the upper surface, the light shielding layer being arranged to the lower surface of the display layer, the light shielding layer having a hole to allow a sensing signal of a fingerprint module to pass through, the display screen and the fingerprint module being fastened to the frame, the fingerprint module being disposed at a side of the light shielding layer away from the display layer and located at a position corresponding to the hole, the fingerprint module comprising a light emitter and a light inductor, and a first light signal emitted by the light emitter and a second light signal received by the light inductor passing through the hole.

19. The mobile terminal according to claim 18, further comprising a light shielding sheet, wherein the light shielding sheet is fastened between the display screen and the fingerprint module.

* * * * *